United States Patent

[11] 3,619,492

[72] Inventor Wayne Wheeler Evans
Indianapolis, Ind.

[21] Appl. No. 829,191
[22] Filed June 2, 1969
[45] Patented Nov. 9, 1971
[73] Assignee RCA Corporation

[54] AUTOMATIC FINE TUNING CIRCUITRY
22 Claims, 1 Drawing Fig.

[52] U.S. Cl. .......... 178/5.8 R, 325/422, 325/453, 325/457
[51] Int. Cl. .......... H04n 5/44, H04n 5/60
[50] Field of Search .......... 178/5.8, 5.8 AF, 5.8 A; 325/418, 419, 420, 422, 453, 471, 417, 457

[56] References Cited

UNITED STATES PATENTS

| | | | |
|---|---|---|---|
| 2,896,018 | 7/1959 | Rhodes et al. | 178/5.8 |
| 3,467,873 | 9/1969 | Buhr | 325/471 |

*Primary Examiner*—Robert L. Richardson
*Attorney*—Eugene M. Whitacre

ABSTRACT: A television system includes means for disabling the application of an automatic fine tuning correction voltage to the television tuner while the tuner's tunable resonant circuits are being adjusted to tune from a first to a second frequency during channel change. During this period, the disabling means establishes a voltage across a variable capacitance device in the tuner's oscillator tunable resonant circuit to approximate the crossover frequency voltages normally applied to the device from the automatic fine tuning circuits. The automatic fine tuning circuit operation is not affected during channel change, and the correction voltage output signals may be employed in a signal seeking system to help detect the presence of a desired television signal. Whenever the disabling means becomes operative, it actuates other circuitry to cause a muting of the television video and sound signals to occur, as well as the energization of a channel change indicator.

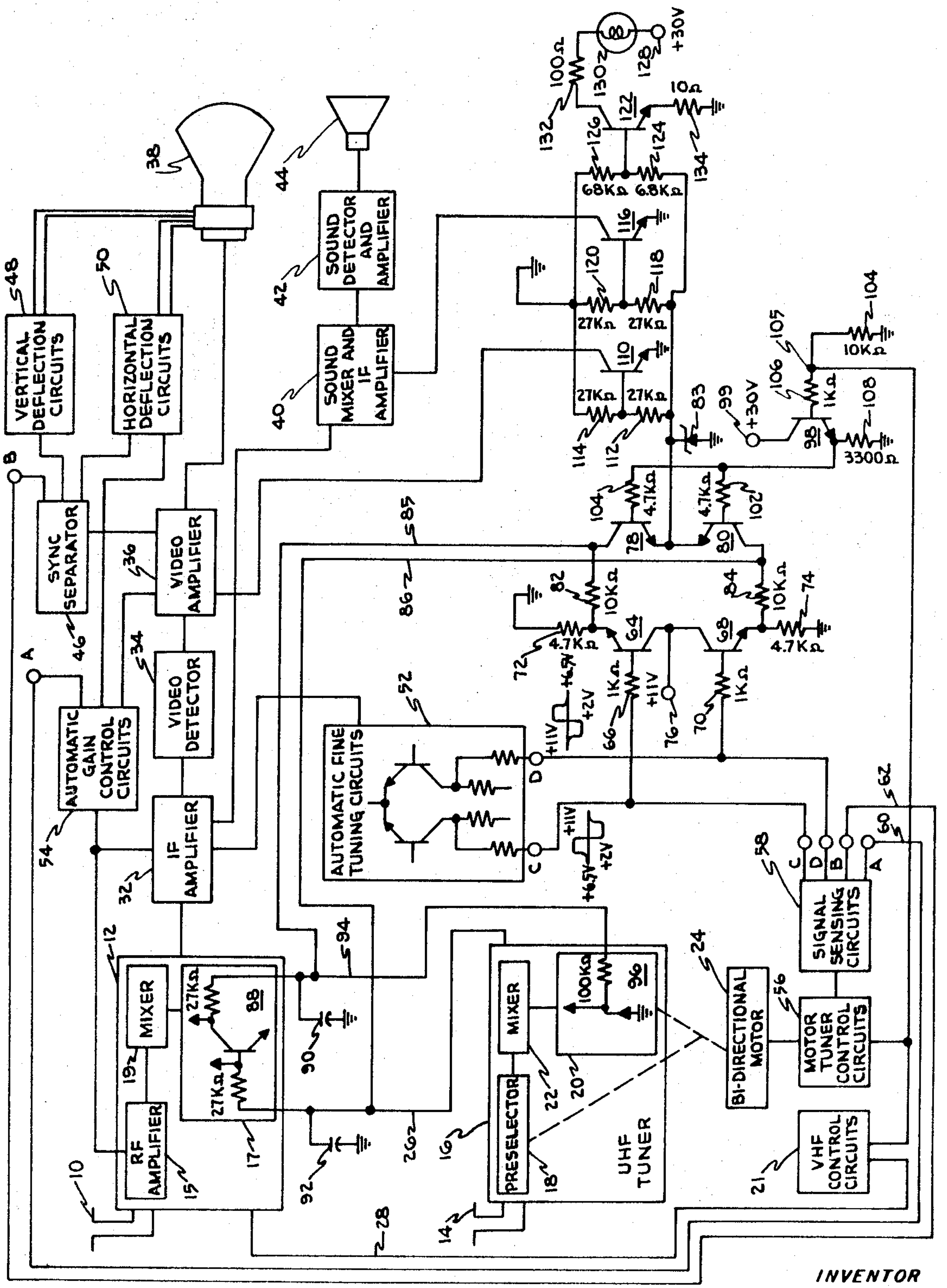
INVENTOR
WAYNE WHEELER EVANS
BY David E. Fidelman
ATTORNEY

AUTOMATIC FINE TUNING CIRCUITRY

The present invention relates to television systems, and more particularly, to a signal seeking television system incorporating automatic fine tuning circuits.

In the television receiver art, it is often desirable to disable the automatic fine tuning circuits during channel change. This has been accomplished in the past by the actuation of a defeat switch by the mechanical motion of the television tuner shaft during channel change. With the advent of electronic tuning, however, no mechanical motion is available during channel change to actuate such a switch. Moreover, the disablement of the automatic fine tuning circuits during channel change poses an additional problem in signal seeking systems that detect the presence of an automatic fine tuning correction voltage as a criterion in sensing the presence of a desired television signal.

In a radio receiver, a system embodying the present invention includes a tuner having an RF stage, a mixer stage and an oscillator stage and having tunable resonant circuits. A voltage responsive variable capacitance device is coupled to the oscillator stage. First means are coupled to the tuner to adjust the tunable resonant circuits to tune to different frequencies within a band of frequencies. A second means provides an output control voltage having a magnitude determined by the frequency deviation of output signals from the mixer stage from a predetermined frequency. The second means provides a predetermined output voltage level at the predetermined frequency. Third means are coupled between the second means and the variable capacitance device for applying the control voltage to the device. A fourth means prevents the control voltage from being applied to the device and establishes an output voltage that approximates the predetermined output voltage level when the first means adjusts the tunable resonant circuits.

In accordance with a feature of the invention, an indicator means may be provided and actuated during the adjustment of the tunable resonant circuits by the first means. The indicator means provide an indication that the tuner's tunable resonant circuits are being adjusted to tune to different frequencies within the band of frequencies.

The radio receiver mentioned above may be a television receiver with switching means coupled between the fourth means and the television receiver. The switching means are actuated by a voltage established in the fourth means when the first means adjusts the tunable resonant circuits to cause a muting of the television video and sound signals.

A complete understanding of the invention may be obtained from the following detailed description of a specific embodiment thereof, when taken in conjunction with the accompanying drawing, in which:

The single FIGURE is a schematic circuit diagram, partly in block form, of a television system embodying the present invention.

Referring now to the drawing, the television receiver shown, except as indicated, may be similar to an RCA CTC-40 series chassis. The CTC-40 series chassis is shown in the publication, "Television Service Data," File 1968, No. T20, prepared by the RCA Sales Corporation, 600 North Sherman Drive, Indianapolis, Indiana 46206. The television receiver is coupled to an antenna 10 for intercepting television signals in the VHF band which are applied to a VHF tuner 12, and an antenna 14 for intercepting television signals in the UHF band which are applied to a UHF tuner 16. The tuner 12 includes an RF amplifier 15 and a local oscillator 17 for generating heterodyning signals. Both the RF amplifier 15 and the local oscillator 17 are coupled to a mixer circuit 19 which mixes the received VHF television signals and the locally generated signals to provide a correspondingly modulated intermediate frequency signal. The tunable resonant circuits of the VHF tuner 12 are controlled by the VHF tuner control circuit 21. The VHF may be a diode switched tuner with the VHF control circuit 21 similar to the system shown in the copending patent application entitled, "Television Electronic Control Circuit for Channel Selection," filed May 29, 1969, Ser. No. 829,057, in the names of Wayne Wheeler Evans and Jerome Benjamin Bean, Jr., and assigned to RCA Corporation.

The tuner 16 includes a resonant UHF preselector 18 and a local oscillator 20 for generating heterodyning signals. The preselector 18 and the local oscillator 20 are coupled to a mixer circuit 22 which mixes the received UHF television signals and the locally generated signals to provide an intermediate frequency output signal. Both the preselector 18 and the oscillator 20 include continuously variable tuning elements which are ganged for movement together and coupled to be driven by a bidirectional motor 24.

The UHF intermediate frequency signals are applied to the VHF tuner 12 via a lead 26. During UHF operation, the VHF RF amplifier 15 and mixer 19 provide amplification of the UHF IF signal. VHF IF signals or amplified UHF IF signals, as the case may be, are amplified in the intermediate frequency amplifier 32 and thereafter detected in a video detector 34. The composite video signal output from the detector 34 includes a video signal which is amplified by a video amplifier 36 and applied to a picture tube 38.

A 4.5 MHz. intercarrier sound signal is produced by the interaction of the picture and sound intermediate frequency signals in a sound mixer which is part of a sound mixer and sound intermediate frequency amplifier stage 40. The sound mixer and sound intermediate frequency amplifier stage 40 derives its input signal from the intermediate frequency amplifier 32. The amplified sound IF output signals from the sound intermediate frequency amplifier are detected and amplified in a sound detector and audio amplifier stage 42 before application to a loudspeaker 44.

The composite video signal is also applied from the video amplifier 36 to a synchronizing signal separator 46. The separator 46 separates the vertical synchronizing pulses and applies them to vertical deflection control circuits 48 to control the vertical deflection of the cathode ray beam in the picture tube 38. The separator 46 also separates and applies the separated horizontal synchronizing pulses to the horizontal deflection control circuit 50 to control the horizontal deflection of the cathode ray beam in the picture tube 38.

Automatic fine tuning circuits 52 are coupled between the IF amplifier 32 and both the VHF tuner 12 and the UHF tuner 16 by circuitry which will be explained in greater detail hereinafter. The automatic fine tuning circuits are of the type used in the CTC-40 chassis, supra, and are described in a U.S. Patent granted to Jack Avins, U.S. Pat. No. 3,444,477. The automatic fine tuning circuit crossover frequency is 45.75 MHz., the frequency of a properly tuned intermediate frequency signal video carrier. The circuits 52 produce a differential DC voltage output signal that is proportional to the frequency of an applied signal which is within the AFT pull-in range. That is, the difference between the output voltages (or differential) represents the amount and direction of frequency deviation of the applied intermediate frequency signal from 45.75 MHz. If the applied signal frequency is exactly 45.75 MHz., each automatic fine tuning circuit output terminal voltage is +6.5 volts. As the applied signal deviates from 45.75 MHz. one output terminal voltage increases and the other decreases an equal amount. The voltage at each terminal will increase or decrease depending on the direction the applied intermediate frequency signal deviates from 45.75 MHz. The automatic fine tuning circuit output voltages provide a correction voltage for a voltage responsive variable capacitance device in each of the tuners 12 and 16. The adjusted capacitance of the variable capacitance devices regulates the oscillator frequency to compensate for the detected detuning of the IF signal video carrier.

An automatic gain control circuit 54 is coupled between the video amplifier 36 and both the intermediate frequency amplifier 32 and the radio frequency amplifier 15 of the VHF tuner 12. The automatic gain control circuit 54 includes a gated amplifier which is "keyed on" by pulses derived from the horizontal deflection circuits 50. The gain control circuit 54 causes the gain of the amplifiers 36 and 15 to be adjusted in response to changing levels of signal in the video amplifier stage, thereby keeping the video amplifier signal level substantially constant.

When the motor control circuits 56 are actuated to cause the bidirectional motor 24 to drive the UHF tuner shaft and thereby tune the preselector and oscillator tunable resonant circuits across the UHF frequency band, the motor will continue to run until a signal is applied to the motor control circuit from the signal sensing circuit 58. The signal sensing circuit 58 provides a signal to the motor control circuit which will stop the bidirectional motor 24 when the signal sensing circuit has detected the presence of a desired television signal.

The signal sensing circuit 58 detects the presence of a desired television signal from input information obtained from the sync separator 46, the automatic fine tuning circuit 52 and the automatic gain control circuit 54, each of which is coupled to the signal sensing circuit 58. Thus, the terminal A associated with the signal sensing circuit 58 is connected by a lead 60 with the terminal A associated with the automatic gain control circuit 54, and a terminal B associated with the signal sensing circuit 58 is connected via a lead 62 with the terminal B associated with the sync separator 46. The output voltages from the automatic fine tuning circuit 52 at the terminals C and D are, likewise, coupled to the corresponding terminals C and D associated with the signal sensing circuit 58. The signal sensing circuit 58 may be similar to the circuits shown in a copending U.S. patent application entitled, "Signal Seeking System," filed June 2, 1969, Ser. No. 829,392, in the name of Wayne Wheeler Evans, and assigned to RCA Corporation.

The open loop automatic fine tuning circuit output voltages at the terminal C and D are shown adjacent the terminals. The open loop automatic fine tuning circuit output voltages are obtained when the voltages are not applied to the variable capacitance device associated with the operative oscillator and, therefore, not correcting oscillator frequency errors to compensate for the detected detuning of the IF signal video carrier. The voltage developed at the terminal C is applied to a transistor 64 via a resistor 66 and the voltage developed at the terminal D is applied to the base electrode of a transistor 68 via a resistor 70. The resistors 66 and 70 provide protection for the transistors 64 and 68 against high voltage kinescope arcs. The emitter electrode of the transistor 64 is returned to a point of reference potential, shown as ground, by a resistor 72, and the emitter electrode of the transistor 68 is returned to the point of reference potential by a resistor 74. Operating potential for the transistors 64 and 68 is obtained from a source of positive potential at a terminal 76. The transistors 64 and 68 are connected as emitter followers. Consequently, the output voltage at the emitter electrode of each transistor is effectively the automatic fine tuning output voltage applied at its base electrode. The emitter-follower transistors 64 and 68 provide isolation between the automatic fine tuning circuit output terminals C and D coupled to their base electrodes and the circuitry connected to their emitter electrodes.

The automatic fine tuning correction voltage developed at the emitter electrodes of the transistors 64 and 68 are applied to the collector electrodes of the transistors 78 and 80 via the resistors 82 and 84, respectively, and via the leads 85 and 86 across a variable capacitance device 88 associated with the tunable resonant circuits of the VHF oscillator 17. In addition, the automatic fine tuning correction voltage developed at the emitter electrode of the transistor 64 is applied via the resistor 82, the lead 85 and the lead 94 across a voltage responsive variable capacitance device 96. The device 96 is coupled to the tunable resonant circuits of the UHF oscillator 20. A capacitor 90 is connected to the junction of the leads 85 and 95 and a capacitor 92 is connected to the lead 86. The capacitors provide a low impedance path to ground for AC signals and prevent an alternating voltage from being developed across the variable capacitance devices.

The emitter electrodes of the transistors 78 and 80 are connected to ground via a 6.2 volt Zener diode 83. The base electrodes of the transistors 78 and 80 are connected to the emitter electrode of a transistor 98 via the resistors 100 and 102 which provide protection for the transistors against possible kinescope arcs in the television receiver. In addition, the resistors 100 and 102 decouple the base electrodes of the transistors 78 and 80 from each other and from the transistor 98 so that base electrode voltages are not clamped at the voltage developed across the resistor 108 when the transistor 98 is conducting. During the channel change operation, a voltage is applied to junction 105 from either the motor control circuit 56, during UHF operation, or the VHF control circuit 21, during VHF operation, to establish a voltage across the resistor 104. The voltage is applied via the resistor 106 to the base electrode of the transistor 98 to bias the transistor into conduction.

Consider the conditions that occur during a channel change operation, when a positive voltage is applied to the base electrode of the transistors 78 and 80 and the resonant frequency of the operative heterodyne oscillator is such that the IF signal video carrier is at a frequency below 45.75 MHz., the automatic fine tuning circuit 52 crossover frequency, but within the automatic fine tuning circuit pull-in range. A voltage of slightly less than +11 volts (the automatic fine tuning terminal C output voltage) develops at the emitter electrode of the transistor 64 when the IF signal video carrier is squarely within the pull-in range. This voltage acts as a source of operating potential for the transistor 78, and current flows from the emitter electrode of the transistor 64 through the resistor 82, the collector-emitter electrode current path of the transistor 78 and the cathode-anode of the Zener diode 83 to ground.

The current flow through the Zener diode 83 causes a regulated voltage of 6.2 volts to be established at the emitter electrode of the transistor 78. As a result, a regulated voltage is established at the collector electrode of the transistor. This voltage is the +6.2 volts appearing at the emitter electrode of the transistor plus the collector-emitter junction potential drop. For silicon transistors, the collector-emitter junction potential drop is approximately +0.2 volts. Consequently, the collector electrode of the transistor 78 is at a regulated voltage of approximately +6.4 volts.

Simultaneously, a voltage of slightly less than +2 volts (the automatic fine tuning terminal D output voltage) develops at the emitter electrode of the transistor 68. Since the emitter electrode of the transistor 80 is connected to the Zener diode 83, it is held at the regulated voltage of +6.2 volts. As a result, a regulated voltage is established at the base electrode of the transistor. This voltage is the +6.2 volts appearing at the emitter electrode plus the emitter-base junction potential drop. For silicon transistors, the emitter-base junction potential drop is approximately +0.7 volts. Consequently, the base electrode of the transistor 80 is at a regulated of approximately +6.9 volts. Under these conditions, the transistor 80 is not biased for normal transistor operation. That is, while the base-emitter junction of the transistor is forward biased, the collector-emitter junction of the transistor is also forward biased, rather than reverse biased as is the case with normal transistor operation. Current, therefore, flows through the base-collector junction of the transistor 80 and the resistor 84 to the emitter electrode of the transistor 68 which, as previously indicated, is at a voltage level of slightly less than +2 volts. Thus, a regulated voltage is established at the collector electrode of the transistor 80. This voltage is the +6.2 volts appearing at the emitter electrode of the transistor plus the +0.7 volt emitter-base potential drop plus the base-collector junction drop. For silicon transistors, the base-collector junction potential drop is approximately −0.7 volts, and the collector electrode of the transistor 80 is at a regulated voltage of approximately +6.2 volts [(+6.2)+(+0.7)+(−0.7)].

The +6.4 volts developed at the collector electrode of the transistor 78 and, therefore, appearing on the lead 85, and the +6.2 volts developed at the collector electrode of the transistor 80 and, therefore, appearing on the lead 86, are very close to the output voltages developed by the automatic fine tuning circuit when the IF signal video carrier is at the crossover frequency (45.75 MHz.). The operating oscillator, at this time, is functioning with essentially the automatic fine tuning circuit crossover frequency output voltage applied to the oscillator's voltage responsive variable capacitance device. Thus, the oscillator frequency is not changed to compensate for any detuning detected by the automatic fine tuning circuit of the IF signal video carrier. As a result, the output voltage from the automatic fine tuning control circuit 52 at the terminals C and D is the open loop correction voltage and may be utilized by the signal sensing circuit 58 in detecting the presence of a television signal.

From the standpoint of the local oscillator operation, the automatic fine tuning circuits are disabled since the voltage applied to the tuner's variable capacitance device is not causing a frequency change. The voltages established at the collector electrodes of the transistors 78 and 80 during channel change approximate a condition where the automatic fine tuning circuits are disabled. In effect, during channel change, the transistors 78 and 80 prevent the automatic fine tuning circuit correction voltages from being applied to the voltage responsive variable capacitance devices and establishes a voltage across the devices which approximates the crossover frequency output voltages normally applied to the devices from the automatic fine tuning circuits.

When the incoming television signal is such that the detected IF signal video carrier is above the crossover frequency of the discriminator but within the automatic fine tuning system pull-in range, the voltages at the emitter electrodes of the transistors 64 and 68 will be reversed from that previously described, as will be the mode of operation of the transistors 78 and 80.

During UHF operation, when the sensing circuit 58 detects all three previously mentioned criteria as being present, a signal is applied to the motor control circuit causing the bidirectional motor to become deenergized Simultaneously, the voltage at the junction 105 is removed, and the transistor 98 becomes biased out of conduction. Similarly, during VHF operation, when the VHF channel change has been completed, the voltage at the junction 105 is removed and the transistor 98 becomes biased out of conduction. When the transistor 98 becomes nonconductive, the transistors 78 and 80 are biased out of conduction. Specifically, the collector-emitter current path of the transistor which was operating in the normal manner becomes nonconductive, as do the base-emitter and base-collector current paths of the other transistor. Consequently, the automatic fine tuning correction voltage developed at the emitter electrodes of the transistors 64 and 68 is applied via the leads 86 and 85 to the VHF tuner 12, and via the leads 85 and 94 to the UHF tuner 16.

When a current is flowing through the Zener diode 83 during both VHF and UHF channel change, the regulated voltage at the cathode of the Zener diode biases three transistors into conduction. A transistor 110 is biased into conduction by the voltage applied to its base electrode by a voltage divider including the resistors 112 and 114; a transistor 116 is biased into conduction by the voltage applied to its base electrode by a voltage divider including the resistors 118 and 120; and a transistor 122 is biased into conduction by the voltage applied to its base electrode by a voltage divider including the resistors 124 and 126. Conduction of the transistor 110 biases a stage in the video amplifier 36 to provide a muting of the video signal at the cathode ray tube 38. For the CTC-40 chassis, supra, the collector electrode of the transistor 110 may conveniently be connected to the base electrode of Q301 on the PW 300 circuit board. Conduction of the transistor 116 biases a stage in the IF sound amplifier to provide a muting of the audio signal at the speaker 44. In the CTC-40 chassis, supra, the collector electrode of the transistor 116 may conveniently be connected to stake P on the PW 300 circuit board.

During channel change, where audio and video muting are provided, it is desirable to provide an indication the system is operating or there would be no indication to the user that the television system is changing channels. The problem is particularly acute during UHF operation, where transmitted television signals may be widely separated throughout the UHF frequency band, with as much as 10 seconds required for the motor 24 to drive the UHF tuner 16 across the band. Consequently, the transistor 122 is provided which is biased into conduction by the voltage at the cathode of the Zener diode 83. When the transistor is conductive a current flows from a source of positive potential applied to the terminal 128, through a lamp 130, the resistor 132, the collector-emitter path of the transistor 122 and the resistor 134 to ground. Thus, during the channel change operation the lamp 130 becomes energized and provides an indication to the user that the system is operative and changing channels.

What is claimed is:

1. In a radio receiver, a system comprising:

a tuner including an RF stage, a mixer stage and an oscillator stage and having tunable resonant circuits;

a voltage responsive variable capacitance device coupled to said oscillator stage;

first means coupled to said tuner to adjust said tunable resonant circuits to tune to different frequencies within a band of frequencies;

second means for providing an output control voltage having a magnitude determined by the frequency deviation of output signals from said mixer stage from a predetermined frequency, said second means providing a predetermined output voltage level at said predetermined frequency;

third means including an impedance isolating stage having an input terminal coupled to said second means and an output terminal coupled to said variable capacitance device for applying said control voltage to said variable capacitance device; and fourth means coupled to said third means impedance isolating stage output terminal for preventing said control voltage from being applied to said variable capacitance device and establishing a voltage at said third means impedance isolating output terminal that approximates said second means predetermined voltage level when said first means adjusts said tunable resonant circuits.

2. A system as defined in claim 1 wherein said fourth means includes a three electrode device having a first electrode, a second electrode and a control electrode for controlling the conductivity of said first-second electrode current path, the first electrode of said device coupled to the output terminal of said isolating stage output terminal and fifth means coupled between the second electrode of said device and a point of reference potential.

3. A system as defined in claim 2 including sixth means for coupling the control electrode of said device and said first means.

4. A system as defined in claim 3 wherein said fifth means is a Zener diode.

5. A system as defined in claim 3 wherein said isolating stage is an emitter follower connected transistor.

6. A system as defined in claim 5 wherein said device is a transistor.

7. A system as defined in claim 6 wherein said fifth means is a Zener diode.

8. A system as defined in claim 7 wherein said Zener diode is connected to the emitter electrode of said device.

9. A system as defined in claim 1 wherein said second means includes a first and a second terminal providing a first and a second output control voltage, each having a predetermined level at said predetermined frequency.

10. A system as defined in claim 9 wherein said third means includes a first impedance isolating stage having an input terminal coupled to said second means first terminal and an output terminal coupled to said fourth means and a second impedance isolating stage having an input terminal coupled to said second means second terminal and an output terminal coupled to said fourth means.

11. A system as defined in claim 10 wherein said fourth means includes a first and a second three electrode device, each having a first electrode, a second electrode and a control electrode for controlling the conductivity of said first-second electrode current path, the first electrode of said first device coupled to said first isolating stage output terminal, the first electrode of said second device coupled to said second isolating stage output terminal, and fifth means coupled between the second electrode of said first and said second device and a point of reference potential.

12. A system as defined in claim 1 including sixth means for coupling the control electrode of said first and said second device and said first means.

13. A system as defined in claim 1 including indicator means actuated when said first means adjusts said tunable resonant circuits.

14. A system as defined in claim 13 wherein indicator means is coupled to said fourth means and actuated by a voltage established in said fourth means when said first means adjusts said tunable resonant circuits.

15. In a television receiver, a system comprising:

a tuner including an RF stage, a mixer stage and an oscillator stage and having tunable resonant circuits;

a voltage responsive variable capacitance device coupled to said oscillator stage;

first means coupled to said tuner to adjust said tunable resonant circuit to tune to different frequencies within a band of frequencies;

second means for providing an output control voltage having a magnitude determined by the frequency deviation of output signals from said mixer stage from a predetermined frequency, said second means providing a predetermined output voltage level at said predetermined frequency;

third means coupled between said second means and said variable capacitance device for applying said control voltage to said variable capacitance device;

fourth means coupled to said third means for preventing said control voltage from being applied to said variable capacitance device and establishing an output voltage that approximates said second means predetermined voltage level when said first means adjusts said tunable resonant circuits; and a first switch means coupled between said fourth means and said television receiver and actuated by a voltage established in said fourth means when said first means adjusts said tunable resonant circuit to cause a muting of the television video signal.

16. A system as defined in claim 15 including indicator means coupled to said fourth means and energized by the voltage established in said fourth means.

17. A system as defined in claim 16 including a second switch means coupled between said fourth means and said television receiver and actuated by the voltage established in said fourth means to cause a muting of the television sound signal.

18. In a television receiver, a system comprising:

a tuner including an RF stage, a mixer stage and an oscillator stage and having tunable resonant circuits;

a voltage responsive variable capacitance device coupled to said oscillator stage;

first means coupled to said tuner to adjust said tunable resonant circuits to tune to different frequencies within a band of frequencies;

second means for providing an output control voltage having a magnitude determined by the frequency deviation of output signals from said mixer stage from a predetermined frequency, said second means providing a predetermined output voltage level at said predetermined frequency;

third means coupled between said second means and said variable capacitance device for applying said control voltage to said variable capacitance device;

fourth means coupled to said third means for preventing said control voltage from being applied to said variable capacitance device and establishing an output voltage that approximates said second means predetermined voltage level when said first means adjusts said tunable resonant circuits; and a switch means coupled between said fourth means and said television receiver and actuated by a voltage established in said fourth means when said first means adjusts said tunable resonant circuit to cause a muting of the television sound signal.

19. In a television receiver, a system comprising:

a tuner including an RF stage, a mixer stage and an oscillator stage and having tunable resonant circuits;

a voltage responsive variable capacitance device coupled to said oscillator stage;

first means coupled to said tuner to adjust said tunable resonant circuits to tune to different frequencies within a band of frequencies;

second means for providing a first and a second output control voltage having a magnitude determined by the frequency deviation of output signals from said mixer stage from a predetermined frequency, said second means providing a first predetermined output voltage level at said first terminal and a second predetermined output voltage level at said second terminal at said predetermined frequency;

a first, a second, a third and a fourth transistor each having a base electrode, an emitter electrode and a collector electrode;

means coupling said first terminal to the base electrode of said first transistor and said second terminal to the base electrode of said second transistor;

a source of operating potential coupled to the collector electrodes of said first and said second transistors;

a first resistor coupled between the emitter electrode of said first transistor and a point of reference, and a second resistor coupled between the emitter electrode of said second transistor and the point of reference potential;

a third resistor coupled between the emitter electrode of said first transistor and the collector electrode of said third transistor and said variable capacitance device and a fourth resistor coupled between the emitter electrode of said second transistor and the collector electrode of said fourth transistor and said variable capacitance device;

a Zener diode coupled between the emitter electrode of said third and said fourth transistor and the point of reference potential; and means coupled between the base electrode of said third and said fourth transistor and said first means.

20. A system as defined in claim 19 including a switch means coupled between said Zener diode and said television receiver and actuated by a voltage established across said Zener diode when said first means adjusts said tunable resonant circuits to cause a muting of the television video signal.

21. A system as defined in claim 19 including a switch means coupled between said Zener diode and said television receiver and actuated by a voltage established across said Zener diode when said first means adjusts said tunable resonant circuits to cause a muting of the television sound signal.

22. A system as defined in claim 19 including a switch means coupled between said Zener diode and said television receiver and actuated by a voltage established across said Zener diode when said first means adjusts said tunable resonant circuits to cause a muting of the television video signal and a muting of the television sound signal.

* * * * *